(12) United States Patent
Glaser

(10) Patent No.: US 7,941,676 B2
(45) Date of Patent: May 10, 2011

(54) PROCESSOR ARRAY HAVING A MULTIPLICITY OF PROCESSOR ELEMENTS AND METHOD OF TRANSMITTING ELECTRICITY BETWEEN PROCESSOR ELEMENTS

(75) Inventor: Rupert Glaser, Höerlkofen (DE)

(73) Assignee: Infineon Technologies AG, Neubiberg (DE)

( * ) Notice: Subject to any disclaimer, the term of this patent is extended or adjusted under 35 U.S.C. 154(b) by 1097 days.

(21) Appl. No.: 10/573,361

(22) PCT Filed: Sep. 15, 2004

(86) PCT No.: PCT/DE2004/002059
§ 371 (c)(1),
(2), (4) Date: Mar. 6, 2007

(87) PCT Pub. No.: WO2005/031550
PCT Pub. Date: Apr. 7, 2005

(65) Prior Publication Data
US 2007/0192647 A1    Aug. 16, 2007

(30) Foreign Application Priority Data
Sep. 24, 2003 (DE) .................................. 103 44 285

(51) Int. Cl.
*G06F 1/26* (2006.01)
(52) U.S. Cl. .......................................... 713/300; 714/25
(58) Field of Classification Search .................. 713/300; 714/25
See application file for complete search history.

(56) References Cited

U.S. PATENT DOCUMENTS

| | | | |
|---|---|---|---|
| 3,631,298 A | 12/1971 | Davis | |
| 5,038,386 A | 8/1991 | Li | |
| 5,814,771 A | 9/1998 | Oakes et al. | |
| 5,941,714 A | 8/1999 | Gorbet et al. | |
| 5,962,934 A | 10/1999 | Fendt et al. | |
| 6,073,185 A * | 6/2000 | Meeker | 710/1 |
| 6,210,771 B1 | 4/2001 | Post et al. | |
| 6,275,920 B1 * | 8/2001 | Abercrombie et al. | 712/14 |
| 6,340,957 B1 | 1/2002 | Adler et al. | |
| 6,766,222 B1 * | 7/2004 | Duley | 700/286 |
| 7,117,126 B2 * | 10/2006 | Floyd et al. | 702/186 |
| 2002/0030475 A1 | 3/2002 | D'Angelo | |
| 2003/0100837 A1 | 5/2003 | Lys et al. | |
| 2003/0139823 A1 | 7/2003 | Ando et al. | |

FOREIGN PATENT DOCUMENTS

DE          3788758          6/1994
(Continued)

OTHER PUBLICATIONS

Post, Rehmi E. et al., "Smart Fabric, or "Wearable Clothing,"" IEEE, pp. 167-168 (1997).

(Continued)

*Primary Examiner* — Chun Cao
(74) *Attorney, Agent, or Firm* — Dicke, Billig & Czaja, PLLC

(57) ABSTRACT

Disclosed is a processor element including a plurality of power supply interfaces, a plurality of power supply switches, and a fault-testing unit for testing whether a short-circuit to a connected adjacent processor element has occurred at a power supply interface. The respective power supply switch is closed in case no short-circuit has occurred such that electricity can be fed to the respective power supply interface.

20 Claims, 5 Drawing Sheets

FOREIGN PATENT DOCUMENTS

| | | |
|---|---|---|
| DE | 19643014 | 10/1996 |
| DE | 10158784 | 8/2003 |
| JP | 11134087 | 5/1999 |
| JP | 11168268 | 6/1999 |
| WO | 0196993 | 12/2001 |

OTHER PUBLICATIONS

Translation of JP Office Action for Japanese Patent Application No. 2006-527265 mailed Jan. 8, 2008 (2 pages).

\* cited by examiner

PROCESSOR ARRAY HAVING A MULTIPLICITY OF PROCESSOR ELEMENTS AND METHOD OF TRANSMITTING ELECTRICITY BETWEEN PROCESSOR ELEMENTS

CROSS REFERENCE TO RELATED APPLICATION

This Utility Patent Application claims the benefit of the filing date of German Application No. DE 103 44 285.5, filed Sep. 24, 2003, and International Application No. PCT/DE2004/002059, filed Sep. 15, 2004, both of which are herein incorporated by reference.

BACKGROUND

Embodiments of the invention relate to a processor array, a fabric structure, a surface-covering structure and a method of transmitting electricity among a large number of processor elements arranged locally adjacent to one another.

In DE 101 58 784 A1, a processor array is described which has a large number of processor elements, each processor element having an image-generating element, such as a light-emitting diode, a memory, a plurality of data communication interfaces and a plurality of power supply interfaces.

The individual processor elements are arranged locally freely within the processor array and are coupled to their respectively immediately adjacent processor elements by means of their data communication interfaces for the purpose of exchanging electrical messages. The processor elements are connected to a common voltage source, the processor elements in each case being coupled to their immediately locally adjacent processor elements by means of their power supply interfaces.

Thus, a network of distributed processors or processor elements, which is fed from a common voltage supply, is described in DE 101 58 784 A1. Such a network is susceptible to electrical short-circuits occurring in the network. A single electrical short-circuit occurring within the context of the common voltage supply leads to the failure of the entire network of processor elements.

Furthermore, a method for the self-organization of the processor elements is described in DE 101 58 784 A1, that is to say substantially for the automatic determination of the position of the processor elements within the processor array in relation to a reference position. The determination of the respective position is carried out with a local exchange of electronic messages only between processor elements arranged immediately adjacent to one another.

A further problem in the network of processor elements described in DE 101 58 784 A1 but generally occurring in an arbitrary network of processor elements, is a synchronous driving of the processor elements in order to output information if the paths from an interface processor arranged at the reference position, which feeds data to all the processor elements of the processor array, are of different lengths.

DE 37 88 758 T2 discloses a polymorphic mesh network which has a network of processing elements and a program-controlled connection control mechanism in order to group the processing elements under program control. Each processing element is coupled to adjacent processing elements via connections.

DE 196 43 014 C1 discloses a bus system for electronic power supply, which has a voltage supply device for controlling the voltage supply to the bus system. The voltage supply device checks whether the voltage output has a sufficiently high resistance and controls the voltage supply of the bus system accordingly.

US 2003/0100837 A1 discloses a network of LED's which are fitted in clothing and coupled to one another.

As will be explained in more detail in the following text, even in the case of faulty processor elements within the processor array, the network of processor elements can still always operate in a functionally adequate manner in order to display symbols and sequences of symbols, for example text, arrows etc., but it is necessary for the faulty processor elements to be masked out within the context of the display of the symbols and sequences of symbols and the transmission of electronic messages which contain the information to be displayed by the image-generating elements. The routing paths have to be reformed around the faulty processor elements, routing paths being combined by means of routing branches. During the display of symbols and graphics, all the image points within a frame which are present in the network of image-generating elements and therefore in the network of processor elements must be driven synchronously.

Depending on the number of image points, the result is a data rate "number of image points contained in the image per second".

These two above-described requirements lead to a very great broadband requirement on the data channels between the processor elements for transmitting the electronic messages with the symbols and graphics to be displayed. If some processor elements in the processor array fail and thus routing channels or routing paths have to be combined, then the data rate needed for the combined channels is additionally increased. Therefore, overdimensioning of the data transmission rate provided is required in order to provide the requisite bandwidth.

SUMMARY

One embodiment of the invention avoids the failure of the entire processor array even in the event of an electric short-circuit occurring within a processor array having a large number of processor elements coupled to one another.

Embodiments include the processor arrangement, the fabric structure, the surface-covering structure and the method for transmitting electricity among the plurality of processor elements arranged locally adjacent to one another.

In one embodiment, a processor array has a large number of processor elements. Each processor element has the following elements:

at least one processor,
a plurality of power supply interfaces for transmitting electricity from and to a plurality of processor elements adjacent to the respective processor element,
a plurality of power supply switches, each power supply interface being assigned a power supply switch, with which electricity can be supplied or not supplied to the respective power supply interface as desired,
at least one short-circuit testing unit for testing whether there is an electrical short-circuit to an adjacent processor element connected electrically to the respective processor,
a control unit, which is set up in such a way that, for the case in which there is no short-circuit on the power supply interface, the respective power supply switch closes, so that electricity can be supplied to the power supply interface.

At least to some extent, in the processor array according to one embodiment of the invention, only the processor elements which are arranged locally directly adjacent to one another are coupled to one another in order to exchange electronic messages and to transmit electricity.

Furthermore, in one embodiment a fabric structure having a processor array described above is provided, the processors being arranged in the fabric structure. Furthermore, the fabric structure has electrically conductive filaments which couple the processors to one another and also conductive data transmission filaments which couple the processors to one another.

Finally, in one embodiment electrically nonconductive filaments are provided in the fabric structure. The fabric structure can be used for covering a surface, in one case a floor, a wall or a ceiling.

The fabric structure can be used in any desired textile fabrics, for example including curtains, textile roller blinds or venetian blinds.

The fabric structure has a plurality of processor elements for electronic data processing, which plurality of processor elements can be supplied with power via electrically conductive filaments likewise provided in the fabric structure and which are supplied the data to be processed by means of the data transmission filaments or can transmit said data via the latter.

As a result of its construction, in one embodiment the fabric structure can be produced in large areas and can simply be cut into any desired shape. Thus, it can be matched to any desired surface on which it is to be laid. It is not necessary to couple the individual processor elements and sensors and/or actuators which may be provided to one another subsequently, since the processor elements are already coupled to one another within the fabric structure.

Expressed in other words, this means that a plurality of processor elements are embedded in the fabric structure for cladding a surface.

The individual processor elements are in one case capable of exchanging electronic messages with other processor elements in the fabric structure via the data transmission filaments, because of components which are additionally provided, and thus of permitting a local determination of the position of the respective processor elements within the fabric structure and in relation to a predefined reference position, that is to say to carry out self-organization. According to one embodiment of the invention, the self-organization is in one case carried out in accordance with the method described in DE 101 58 784 A1.

It thus becomes possible for a processor element to determine its position within an area without additional external information, even if a fabric structure is brought into a predefined shape by cutting, it being possible for processor elements or coupling lines between the individual processor elements to be destroyed or removed by the cutting.

It is therefore made possible, in the case of a self-organization of the processor elements, to configure a fabric structure for the mass market in a very simple, inexpensive manner and, in order to lay the fabric structure, to tailor the latter in accordance with a predefined desired shape and, despite the additional electronics integrated into said fabric, not to have to take note of the positions at which the processor elements are arranged within the area covered with said structure in order that the respective processor element can be addressed uniquely within the fabric structure.

A surface-covering structure has a fabric structure on which a surface covering is fixed. The fixing is in one case carried out by means of adhesion and/or lamination and/or vulcanization.

In the case in which use is made of the method described in DE 101 58 784 A1 and the processor array described in DE 101 58 784 A1, only local information is used and electronic messages are in particular exchanged between processor elements arranged immediately adjacent to one another.

For this reason, the procedure is very robust with respect to faults and failures which occur at individual processor elements or individual connections between two processor elements if these connections are destroyed, for example when cutting the fabric structure to a predefined shape.

In a method for transmitting electricity between a large number of processor elements arranged locally adjacent to one another, each processor element has the elements described above and, in the method, a check is made at a power supply interface of a processor element as to whether there is an electric short-circuit to an adjacent processor element coupled to the processor element, that is to say connected to the latter. For the case in which there is no electrical short-circuit at the power supply interface, the respective power supply switch is closed, so that electrical energy can be supplied to the power supply interface and is thus provided to the adjacent processor element connected to the processor element.

In this way, according to one embodiment of the invention, an electronic circuit and a corresponding method are provided in a processor element of a processor array described above, by means of which a controlled construction of the power supply paths is provided in a controlled manner without there being the risk that an electric short-circuit between the two processor elements will destroy the entire processor array.

Obviously, regions in which electric short-circuits occur and are determined by means of the above-described method and the above-described array are masked out and deactivated automatically during the construction of the channels for power supply.

The refinements of the invention described in the following text relate to the processor arrangement, the fabric structure, the surface-covering structure and the method for transmitting electricity between a large number of processor elements arranged locally adjacent to one another.

According to one refinement of the invention, provision is made for at least some of the processor elements to have a sensor and/or an actuator which is/are coupled to the processor. In this case, sensor data and/or actuator data is transmitted in the electronic messages between the processor elements arranged adjacent to one another.

According to one refinement of the invention, the at least one short-circuit testing unit has a current limiting device. According to this refinement of the invention, secure and simple testing as to whether there is an electric short-circuit is made possible without the processor element to be tested itself being endangered.

According to another refinement of the invention, each power supply switch can be assigned a current limiting device, at least some of the power supply switches being set up as current-limited switches. This configuration of the invention permits simple and inexpensive production of a processor element according to one embodiment of the invention and therefore of the processor array according to the invention.

The processor elements of the processor array are in one case arranged in matrix form in rows and in columns.

Furthermore, according to a refinement of the invention, the processor array has at least one interface processor, which provides a message interface of the processor array and is able to "inject" electronic messages into the processor array, that is, can transmit electronic messages into the latter. Therefore, sensor and/or actuator data is transmitted from and to the interface processor in the electronic messages.

According to one refinement of the invention, provision is made for the electrically conductive filaments to be set up in such a way that they can be used to supply power to the plurality of processor elements.

In the fabric structure, the conductive data transmission filaments can be electrically conductive.

In another refinement of the fabric structure, the conductive data transmission filaments are optically conductive.

The plurality of processor elements can be arranged in a regular pattern in the fabric structure, in one case in a regular rectangular or square pattern.

Each processor element from a plurality of processor elements is in one case coupled to all the immediately adjacent processor elements by means of the conductive filaments and the conductive data transmission filaments, that is to say in the case of a regular rectangular pattern, to four adjacent processor elements in each case.

A sensor according to one embodiment of the invention in a processor element is configured as a pressure sensor, a heat sensor, a noise sensor, an optical sensor or as a sound sensor.

In one refinement of the invention, provision is also made for an actuator provided in the processor element to be configured as an image-generating element, as a sound wave generating element or as a vibration-generating element.

Expressed in other words, this means that a respective processor element has at least one actuator integrated therein. The actuator is, for example, an image-generating unit or a sound-generating unit, in one case a liquid crystal display unit or a polymer electronic display unit, in general any type of display unit, or a loudspeaker which produces a sound wave, generally any element producing an electromagnetic wave. A further possible actuator provided in a processor element is a vibration-generating element.

According to another refinement of the invention, in the processor array the plurality of processor elements is set up in such a way that, in order to determine a respective distance of a first processor element from a reference position, electronic messages are exchanged between the first processor element and a second processor element adjacent thereto in the processor array. Each electronic message contains an item of distance information which indicates the distance of a processor element transmitting the message or a processor element receiving the message from the reference position. Furthermore, the plurality of processor elements is set up in such a way that, from the item of distance information from a received message, the individual distance to the reference position can be determined and/or stored.

In one embodiment, the processor elements are set up in accordance with DE 101 58 784 A1 in order to carry out self-organization and to determine an item of distance information, with which the distance from a predefined reference position of the respective processor element within the processor array is specified.

The surface-covering structure is in one case formed as a wall-covering structure or floor-covering structure or ceiling-covering structure.

The surface-covering structure can have a textile interspersed uniformly with electrically conductive wires, at least over some regions of the fabric structure.

The textile interspersed with electrically conductive wires can be used in human surroundings in order to avoid "electric smog". In this way, the "electric smog" can be shielded. In this case, however, it is necessary to take note that possibly specific regions, in particular regions above capacitive sensors, must not be covered by the shielding.

Embodiments of the invention are suitable for use in the following areas of application:
  domestic automation, in particular in order to increase domestic convenience,
  alarm systems with position determination and optional determination of the weight of an intruder,
  automatic visitor guidance at fairs, at an exhibition or in a museum,
  for a guide system in an emergency situation, for example in an aircraft or in a train in order to indicate the passengers a path to an emergency exit,
  in fabric concrete constructions, in which fabric structures can be used to detect possible damage and, if appropriate, indicate it to a user,
  obtaining information for managing statistics about the regions in a business in which customers stay and for how long.

A fabric structure according to one embodiment of the invention, in addition to a basic fabric consisting of synthetic fibers (electrically nonconductive filaments), contains conductive filaments, in one case conductive warp and weft filaments, which in one case consist of metal wires, for example copper, polymer filaments, carbon filaments or other electrically conductive wires. If metal wires are used, a coating of nobler metals, for example gold or silver, is in one case used for corrosion prevention in the presence of moisture or in the event of possible contact with the aggressive medium. Another possibility is to isolate metal filaments by applying an insulating varnish, for example polyester, polyamidine amide or polyurethane.

In addition to electrically conductive fibers, optical fibers made of plastic or glass can be used as data transmission filaments. The basic weave of the fabric structure is in one case produced in a thickness which is matched to a thickness of the microelectronic components to be integrated, also called microprocessor modules in the following text, for example sensors, light-emitting diodes and/or microprocessors. A sensor can be, for example, a pressure sensor, a heat sensor, a noise sensor, an optical sensor or a sound sensor.

A spacing of the optically and/or electrically conductive fibers is in one case chosen such that it matches a connection pattern of the processor elements to be integrated.

Even though the following exemplary embodiment describes a carpet arrangement, the invention is not restricted to a carpet but can be applied to any element suitable for surface covering or surface cladding, in general to any processor array and any processor element in which it is necessary that electric short circuits to adjacent processor elements have to be detected.

The fabric structure according to embodiments of the invention with integrated microelectronics and/or sensors and/or actuators, for example small display lamps, is intrinsically fully functional and can be fixed under various types of surface coverings.

In this case, mention should be made, for example, of nonconductive textiles, floor coverings made of carpet, parquet, plastic, curtains, roller blinds, wallpapers, insulating mats, tent roofs, plaster layers, screed and textile concrete. The fixing is in one case carried out by means of adhesive bonding, lamination or vulcanization.

According to an alternative configuration of the invention, a processor array is provided
  with at least one interface processor, which provides a message interface of the processor array,
  with a multiplicity of processors, at least to some extent only the processors arranged immediately locally adjacent to one another being coupled to one another in order to exchange electronic messages, in which each processor of the multiplicity of processors is assigned an actuator and is coupled to the respective processor, actuator data being transmitted by the interface processor in the electronic messages, with at least one clock generating device for the synchronous clocking of the processors, and with a unit for assigning a time stamp to an electronic message with actuator data which has to be transmitted to a processor in order to carry out an action at a predefined time, the time stamp specifying the number of cycles after which the action is to be carried out by the respective processor in accordance with the actuator data.

In this connection, it should be noted that synchronous clocking is not absolutely necessary.

The processor array can have a processor element distance memory, in which the distance of the respective processor elements from the interface processor are stored.

Furthermore, a timestamp determining unit can be provided, which is set up for determining the requisite time stamp in relation to an electronic message by using the distances of the respective processor elements from the interface processor.

The processors of the processor array are in one case arranged in matrix form in rows and columns.

According to one refinement of the invention, the above-described processor array is contained in a fabric structure, the processors and/or sensors and/or actuators being arranged in the fabric structure, the fabric structure having electrically conductive filaments which couple the processors to one another, and conductive data transmission filaments which couple the processors to one another and to electrically nonconductive filaments.

In the fabric structure, the electrically conductive filaments can be set up in such a way that they can be used for the power supply to the plurality of processors and/or sensors and/or actuators.

In the fabric structure, the conductive data transmission filaments are electrically conductive, in one case optically conductive.

The actuator is in one case set up as at least one of the following elements:

an image-generating element or a sound wave generating element or a vibration-generating element.

In the case of a surface-covering structure, a surface covering is in one case fixed on a fabric structure.

In the case of a surface-covering structure, the surface covering is adhesively bonded and/or laminated and/or vulcanized on the fabric structure.

A surface-covering structure according to one refinement of the invention is formed as:

a wall-covering structure or a floor-covering structure or a ceiling-covering structure.

Furthermore, in the case of a surface-covering structure, a textile layer interspersed uniformly with electrically conductive wires can be applied at least over subregions of the fabric structure.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
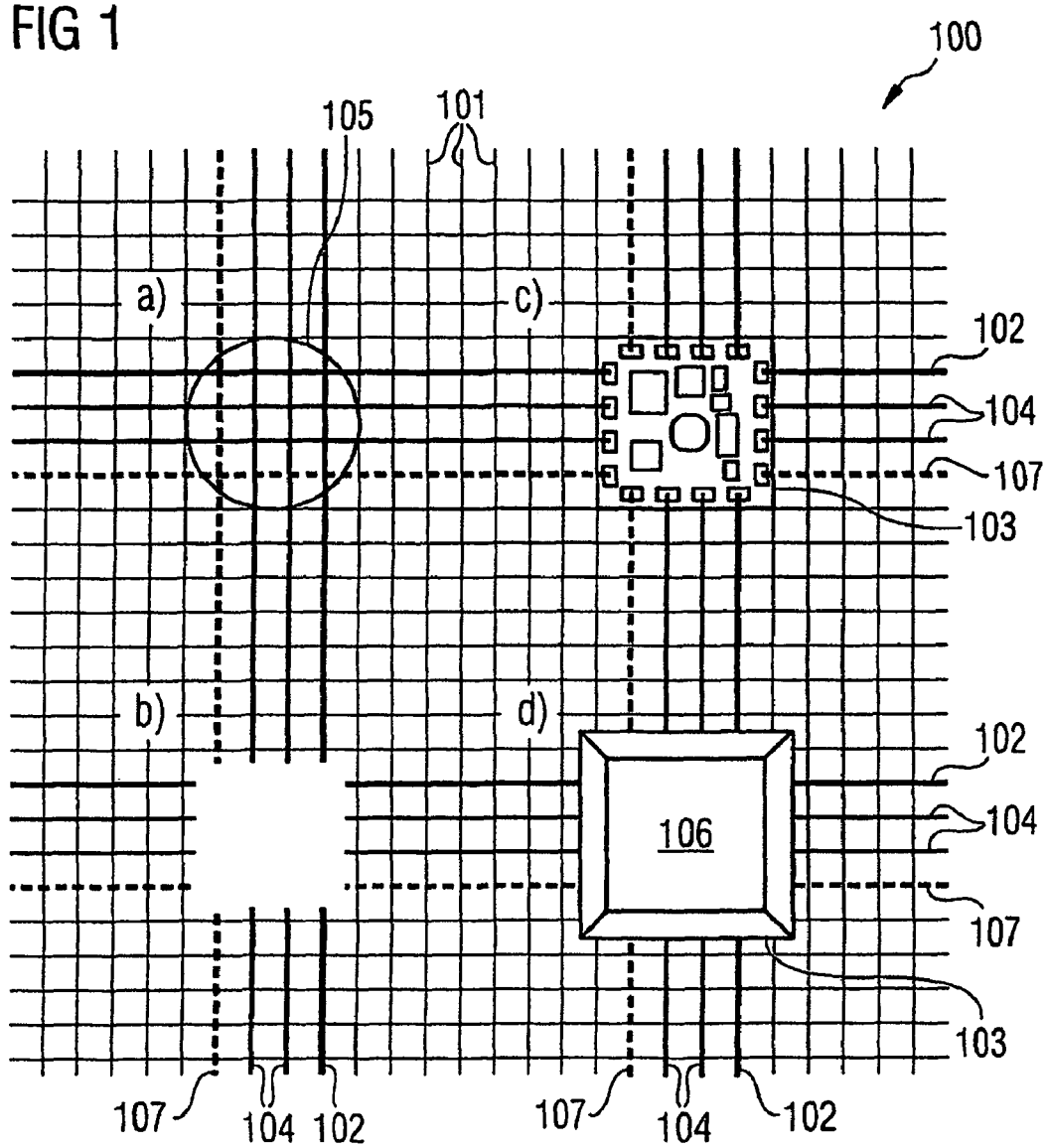
FIG. 1 illustrates a fabric structure according to one embodiment of the invention as a coarse-mesh fabric having conductive filaments and integrated microelectronics, four regions a), b), c) and d) being marked in FIG. 1.

In FIG. 1, a schematic illustration of a processor array embedded in a fabric structure 100 according to an exemplary embodiment of the invention is illustrated.

The fabric structure 100 according to one embodiment of the invention has a coarse-mesh weave as basic structure, which is formed from non-conductive filaments 101. Furthermore, the fabric structure 100 has first electrically conductive filaments 102 and second electrically conductive filaments 107. The first electrically conductive filaments 102 are used if necessary as a grounding means for the microelectronic components 103 to be integrated into the fabric structure 100. The second electrically conductive filaments 107 are used for the power supply of the processor elements 103 to be integrated into the fabric structure 100.

Furthermore, the fabric structure 100 in each case has two conductive data transmission filaments 104, which are used for the data transmission from and to the integrated processor elements 103.

The electrically conductive filaments 102, 107 and the conductive data transmission filaments 104 are in one case placed in a square pattern in the weave, so that a square pattern of crossing points 105 is formed in the fabric structure 100.

A region of such a crossing point is marked with a) in FIG. 1.

Furthermore, in a region which is marked with b) in FIG. 1 and belongs to a crossing point 105, the electrically conductive filaments 102, 107 and the conductive data transmission filaments 104 are removed, which forms a gap in the fabric structure 100.

In the region c) of FIG. 1, a processor element 103 is arranged in a gap in the fabric structure 100, the electrically conductive filaments 102, 107 and the conductive data transmission filaments 104 being coupled to the processor element 103 in order to supply the processor element 103 with electricity and to provide the data transmission line for the processor element 103.

In the fabric structure 100 according to one embodiment of the invention, a processor element 103 is arranged at a respective crossing point 105 of the electrically conductive filaments 102 and 107 and the conductive data transmission filaments 104 and subsequently coupled to the electrically conductive filaments 102 and 107 and the conductive data transmission filaments 104, which are led up to the processor element 103 from four sides.

The coupling between the processor element 103 and the electrically conductive filaments 102 and 107 and the conductive data transmission filaments 104 can be implemented by means of making contact through a flexible printed circuit board or by means of what is known as wire bonding. Alternatively, the contact can be made by means of adhesive bonding.

Illustrated schematically in the region d) of FIG. 1 is a processor element 103 which is encapsulated in order to insulate the coupling region (contact points) between processor element 103 and the electrically conductive filaments 110, 107 and the conductive data transmission filaments 104 and, furthermore, to provide mechanically robust and water-resistant protection 106.

A fabric structure 100 according to one embodiment of the invention in each case has a processor element 103 at a plurality of crossing points 105. Such an "intelligent" fabric structure 100 can form as a base layer or as an intermediate layer of a wall covering or floor covering or other types of technical textiles.

It can also be used, for example, as a layer of a textile concrete construction. The processor elements 103 of the fabric structure 100 can be coupled to a large number of different types of sensors and/or actuators. For example, these can be LEDs (light-emitting diodes), display elements or displays, in order to display information which is transmitted to the processor elements 103 or to transmit sensor data acquired by the processor elements 103 to an evaluation system via the interface processor.

Figure 2:
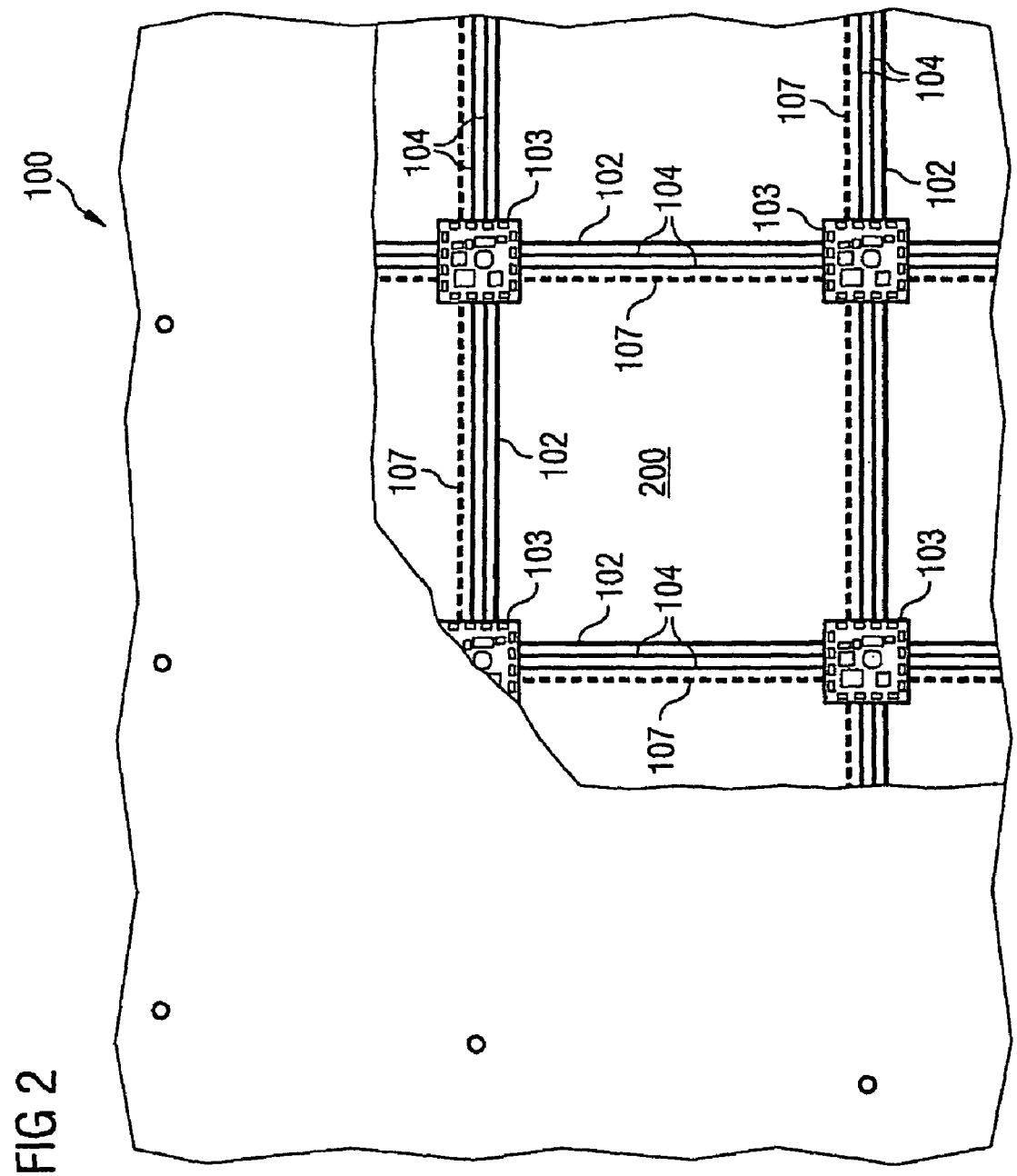
FIG. 2 illustrates a fabric structure according to an exemplary embodiment of the invention on subregions of which a dark carpet is fixed.

FIG. 2 illustrates an exemplary embodiment of what is known as an intelligent carpet having a processor array according to one embodiment of the invention.

Illustrated in the bottom right part of FIG. 2 is a coarse-mesh basic weave 200, in which conductive filaments 102, 104 and 107 are woven in a square pattern. At crossing points 105 of the conductive filaments 102, 104 and 107, processor elements 103 are arranged in the course-mesh basic weave 200. Thus, a regular pattern comprising processor elements 103 is produced, with which in each case contact is made on four sides by supply lines and data lines, the processor elements 103 additionally being provided with an encapsulation and with a light-emitting diode and/or with a pressure sensor.

Furthermore, in the left and rear part of FIG. 2, a carpet is fixed on the fabric structure 100.

The fabric structure 100 according to one embodiment of the invention with integrated microelectronics, in particular with integrated processor elements 103 with sensors and/or actuators, for example small indicating lamps, is intrinsically fully functional and can be fixed under various types of surface coverings. In this case, for example, nonconductive textiles, floor coverings made of carpet, parquet, plastic, curtains, roller blinds, wallpapers, insulating mats, tent roofs, plaster layers, screed and textile concrete should be mentioned.

The fixing is in one case carried out by means of adhesive bonding, laminating, or vulcanizing. In order to avoid "electrical smog" in human surroundings, a textile interspersed uniformly with electrically conductive wires can also be applied over the fabric structure according to one embodiment of the invention for the purpose of shielding. In this case, however, it is necessary to note that, if appropriate, specific regions, for example regions above capacitive sensors, must not be covered by the shielding.

The fabric structure according to one embodiment of the invention with integrated microelectronics is coupled to a central control unit, for example a simple personal computer, at a point at the edge of the fabric structure.

Using simple algorithms, the processor elements begin to organize themselves in the method described in DE 101 58 784 A1. If a fabric structure which has a network of processor elements is connected, that is to say started up, then a learning phase begins, after which each processor element knows its exact physical position in the pattern.

Furthermore, paths for data streams through the pattern are configured automatically, through which sensor information or display information about defective regions of the fabric structure can be conducted. By means of the self-organization of the network, defective regions are detected and circumvented. As a result, the network of microelectronic modules is also still serviceable if the fabric structure 100 is cut into a shape which is predefined by the respective intended use. Furthermore, the self-organization has the effect that no manual installation effort is needed for the network of microelectronic modules.

Figure 3:
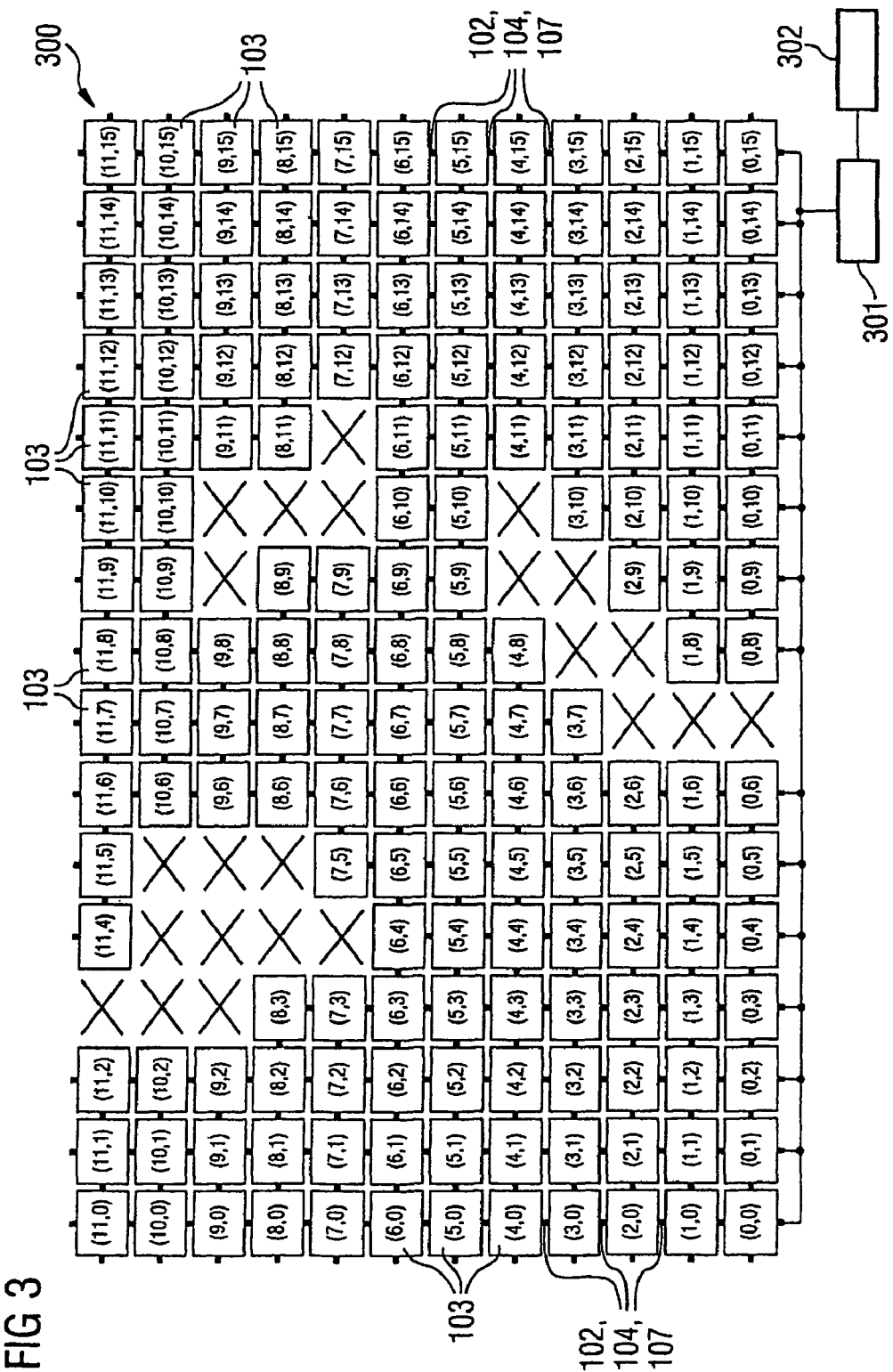
FIG. 3 illustrates a sketch of a processor array according to an exemplary embodiment of the invention, which is provided in the fabric structure.

FIG. 3 illustrates a schematic view of a processor array 300 of the fabric structure 100 from FIG. 1 and FIG. 2 with a large number of processor elements 103 which are embedded in a textile element, as described above.

The processor elements 103 are introduced in each case at a respective crossing point 105 of two textile filaments arranged substantially at right angles to each other, as described above in connection with FIG. 1.

According to a first alternative embodiment, provision is made for the textile filaments themselves to be electrically conductive. If they are not then, in another refinement of the invention, provision is made, as described above, for there to be electrically conductive lines 102, 104, 107 in the textile filaments for the transmission of electric signals.

By means of the electrically conductive textile fibers or by means of the electric lines 102, 104, 107, the processor elements 103 immediately adjacent to one another in the textile weave 100 are coupled to one another in order to exchange electronic messages.

Furthermore, a portal processor provided as an interface processor 301 is provided, which is connected to at least one of the processor elements 103 in the textile element 100 in order to feed in and read out messages to and from the processor array 300. Furthermore, an evaluation system 302 coupled to the interface processor 301 is provided, set up as a personal computer, with which an evaluation of the sensor data acquired by the sensors of the processor elements 103 and transmitted out of the processor array 100 via the interface processor 101 to the evaluation system 102 is carried out, for example statistical monitoring of the data, threshold value checking, etc.

The processors of the processor elements 103 determine their position relative to the interface processor or processors 102 within the context of self-organization in a method as described in DE 101 58 784 A1.

The processors of the processor array 100 are arranged with respect to the interface processor 101 in a tree structure with different hierarchical levels. In this connection, a hierarchical level is to be understood as a distance with respect to the message flow, defined in a number of other processors lying between the processor considered and the portal processor.

The processors of the processor array 300 are clocked synchronously by means of a global synchronous clock generator (not shown).

Figure 4:
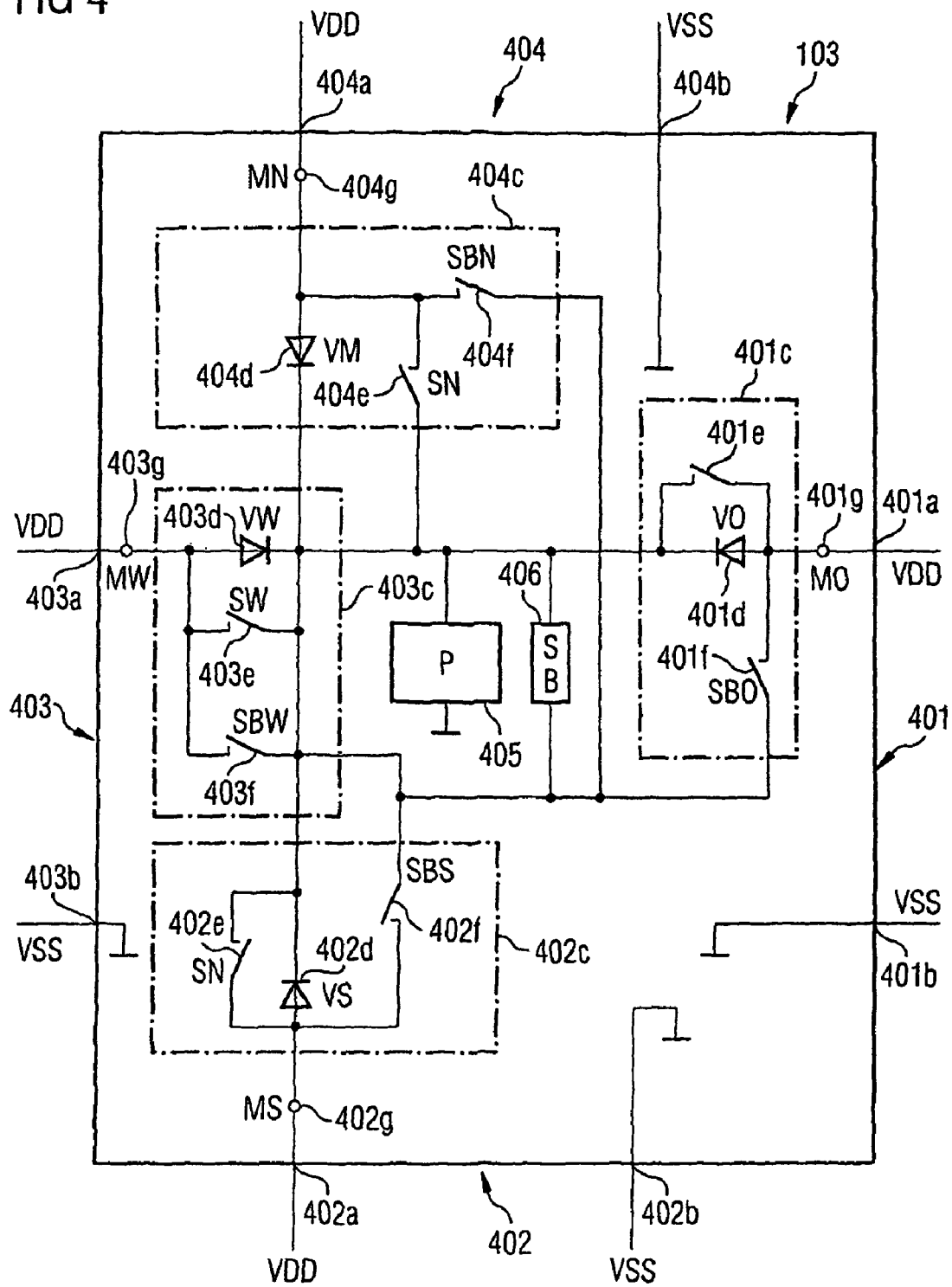
FIG. 4 illustrates a sketch of a processor element according to an exemplary embodiment of the invention.

FIG. 4 illustrates the structure of the processor element 103 in detail.

As described above, the processor element 103 has four ports, a first port 401, a second port 402, a third port 403 and a fourth port 404, each port in each case having a first operating voltage terminal 401a, 402a, 403a, 404a for the respective application of a first electric operating potential $V_{DD}$ and a second, power supply terminal 401b, 402b, 403b, 404b, in one case a ground terminal for the application of an electric ground potential to the respective port 401, 402, 403, 404.

Each first power supply terminal 401a, 402a, 403a, 404a, also designated an operating voltage terminal, of the processor element 103 is coupled to a respective associated first power supply terminal of an adjacent processor element coupled appropriately to the processor element 103.

In a corresponding way, the respective second power supply terminal 401b, 402b, 403b, 404b is coupled to the respective second associated power supply terminal of the processor element arranged immediately locally adjacently.

According to one embodiment of the invention, the respective second power supply terminal 401b, 402b, 403b, 404b is connected jointly to a collection point or to a common ring. On account of their appropriate wiring, diodes 401d, 402d, 403d, 404d ensure that the processor 405 is supplied with voltage, irrespective of the port 404, 402, 403, 404 from which the operating voltage is supplied.

The first operating voltage terminal 401a, 402a, 403a, 404a and the respective associated second operating voltage terminal 401b, 402b, 403b, 404b together form a respective power supply interface of the processor element 103.

In this connection, it should be pointed out that, in principle, any desired number of ports and thus any desired number of processor elements arranged adjacently and coupled to a processor element can be provided, so that the invention is not restricted to four ports and thus four adjacent processor elements.

Furthermore, a microprocessor 405 and also a current-limiting unit 406 are provided in the processor element 103.

The processor element 103 also has four diode arrays 401c, 402c, 403c, 404c functioning as current valves and voltage valves, as can be seen, each diode array 401c, 402c, 403c, 404c in each case being assigned to a port 401, 402, 403, 404 of the processor element 103, and a first terminal of the diode array 401c, 402c, 403c, 404c in each case being coupled to the associated first power supply terminal 401a, 4042a, 403a, 404a.

In this connection, it should be noted that, for the purpose of simplified illustration of the invention in FIG. 4, only the lines relating to the electric power supply are illustrated but not the lines likewise provided in the processor element 103 for the transmission of data.

Each diode array 401c, 402c, 403c, 404c has a diode 401d, 402d, 403d, 404d and a first switch 401e, 402e, 403e, 404e and a second switch 401f, 402f, 403f, 404f.

Given an appropriate setting of the respective switches, the processor 405 is coupled via the respective diode arrays 401c, 402c, 403c, 404c to the respective first power supply terminal 401a, 402a, 403a, 404a at which the first operating potential $V_{DD}$ is provided.

As an alternative to a respective diode 401d, 402d, 403d, 404d, a transistor in a diode connection can be used.

In the processor 405, a short-circuit testing unit is provided in the form of a computer program, with which it is checked whether, at a power supply terminal 401a, 402a, 403a, 404a to be checked in each case, there is an electric short-circuit to a processor element arranged adjacently and coupled to the respective electric power supply terminal.

The computer program stored in the processor 405 and executed by the latter is set up in such a way that the following method is carried out.

In an iterative method, that is to say for all four first power supply terminals 401a, 402a, 403a, 404a, the following method is carried out sequentially in one case.

The supply voltage $V_{DD}$ and $V_{SS}$ is applied to the port 401, 402, 403, 404. This means that, starting with a processor element coupled to the interface processor, the method described is carried out and the testing for a short-circuit is carried out step by step by all serviceable processor elements successively for the adjacent processor elements coupled to the respective processor element.

At the selected port 401, 402, 403, 404 of one of the processor elements 103, during the testing for an electric short-circuit, the supply voltage is thus fed in. The construction of the power supply paths is carried out from this processor element.

In an alternative configuration of the invention, the power supply can be fed in starting at any desired processor element of the processor array.

The first processor element 103 controls the power supply construction to its three adjacent processor elements arranged immediately locally adjacent to it and coupled to it and not yet supplied with power.

After the power supply has been supplied to the processor element, the processor element 103 and therefore the processor 405 of the processor element 103 has a power supply only via that port 401, 402, 403, 404 at which the electricity was fed in, and the supply voltage $V_{DD}$, $V_{SS}$ is connected only to the one first power supply terminal 401a, 402a, 403a, 404a at which the supply voltage is supplied.

According to one embodiment of the invention, the supply voltage is applied to the processor 405 by using the current-limiting unit 406 for limiting the current of the electric voltage supplied to it, that is to say the operating potential $V_{DD}$ is applied to a second port 401, 402, 403, 404 on which an operating voltage $V_{DD}$ is not yet present, so that the operating potential $V_{DD}$ is likewise applied to the port 401, 402, 403, 404 of the processor element 103 and is supplied via the latter to the adjacent processor element.

If there is an electric short-circuit in the electrical connection to the adjacent processor element at this port, this is detected by the processor 405 and the processor 405 dismantles the electricity supply coupling again and marks this port as damaged or faulty.

Alternatively, provision can be made for the ground potential or the second operating potential $V_{SS}$ to be applied to the port 401, 402, 403, 404 of the processor element 103, in which case the transistors in the switches are formed as NMOS field effect transistors. In this case, the respective diode 401*d*, 402*d*, 403*d*, 404*d*, the respective first switches 401*e*, 402*e*, 403*e*, 404*e* and the respective second switches 401*f*, 402*f*, 403*f*, 404*f* have to be inserted into the supply path of the ground potential or the second operating potential $V_{SS}$.

At a measurement junction 401*g*, 402*g*, 403*g*, 404*g*, which is located in each case between the first power supply terminal 401*a*, 402*a*, 403*a*, 404*a* and the respective diode array 401*c*, 402*c*, 403*c*, 404*c*, the processor 405 can, according to one embodiment of the invention, measure the electric voltage level in order to determine from which direction, that is to say from which port 401, 402, 403, 404, the electric operating potential $V_{DD}$ is supplied, in order to close the respective first switch 401*e*, 402*e*, 403*e*, 404*e*, so that a voltage drop possibly occurring on the respective diode 401*d*, 402*d*, 403*d*, 404*d* is minimized or eliminated.

Following the application of a power supply safeguarded by the current-limiting unit 406, the respective other port 402, 403, 404 is successively tested as described above for an electric short-circuit which may possibly be present.

To this end, the second switches 401*f*, 402*f*, 403*f*, 404*f* are used.

After this testing phase has been completed, which can also be viewed as an initialization of the respective processor element with accounts of the power supply, those first switches 401*e*, 402*e*, 403*e*, 404*e* of the diode arrays 401*c*, 402*c*, 403*c*, 404*c* are closed in which it has been determined that no electric short-circuit to the respectively adjacent processor element, that is to say the respective adjacent processor element, has occurred.

In an alternative embodiment, no central current-limiting unit 406 is provided; instead the current-limiting unit 406 is implemented in each diode array 401*c*, 402*c*, 403*c*, 404*c*. In this case, the second switch 401*f*, 402*f*, 403*f*, 404*f* is in one case set up as a current-limited switch.

The switches can be implemented in any desired way as a switching element, for example in the form of a relay contact, as a field effect transistor, in the form of a suitably wired bipolar transistor, etc.

The method described above is carried out and tested by each processor element of the processor array for all its ports 401, 402, 403, 404 coupled to a respective adjacent processor element.

Thus, as can be seen, a power supply voltage network is built up successively, automatically and in a self-organized manner in the processor array.

If, after testing for electric short-circuits has been carried out, all the ports 401, 402, 403, 404 of the processor element 103 have been initialized, the processor element waits for further instructions, in particular relating to the transmission of electronic messages or to the display of information contained in the electronic messages by means of the image-generating elements likewise contained in the processor element but not illustrated.

After the safeguarded power supply construction within the processor array has been carried out, the self-organization described in DE 101 58 784 A1 is carried out in order to determine the distance of the respective processor elements in relation to a predefined reference position.

If an electric short-circuit has been detected on a port 401, 402, 403, 404 by the processor 405, then the respective port 401, 402, 403, 404 is marked as faulty and the respective first switch 401*e*, 402*e*, 403*e*, 404*e* continues to be kept open, that is to say is not closed.

Figure 5:
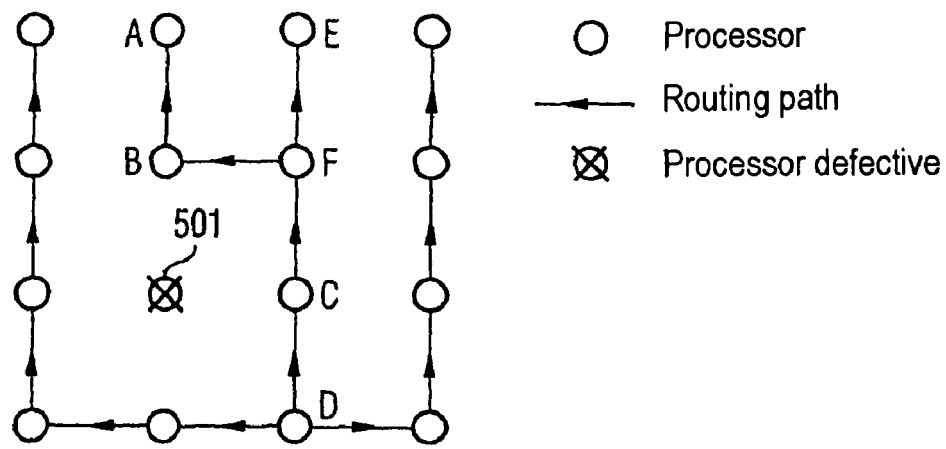
FIG. 5 illustrates a sketch of a processor array in which a problem of a failure of a processor element is illustrated.

As illustrated in FIG. 5, in the event of a faulty processor element, it is necessary that, in order to display information by means of the image-generating element to each processor element 103 within the processor array, the information to be displayed and information about the driving of its at least one image-generating element, for example a light-emitting diode, is stored in a memory of the processor element 103.

The interface processor, set up according to one embodiment of the invention as a personal computer, calculates the pattern which is stored in each case in the processor elements 103 on the basis of the feed point of the data and the symbols which are to be displayed by the processor elements 103 and the image-generating elements provided therein.

As illustrated in FIG. 5, in the event of a failure of a processor element (a failed processor element is designated by reference symbol 501 in FIG. 5), the routing paths have to be combined by routing branches.

FIG. 5 illustrates that the processor elements designated by A and by B are supplied with electronic messages and, moreover, with the data to be displayed, via the processor elements designated by C and D and F, the processor elements C, D, F additionally having to supply the processor element designated by E with data.

Figure 6:
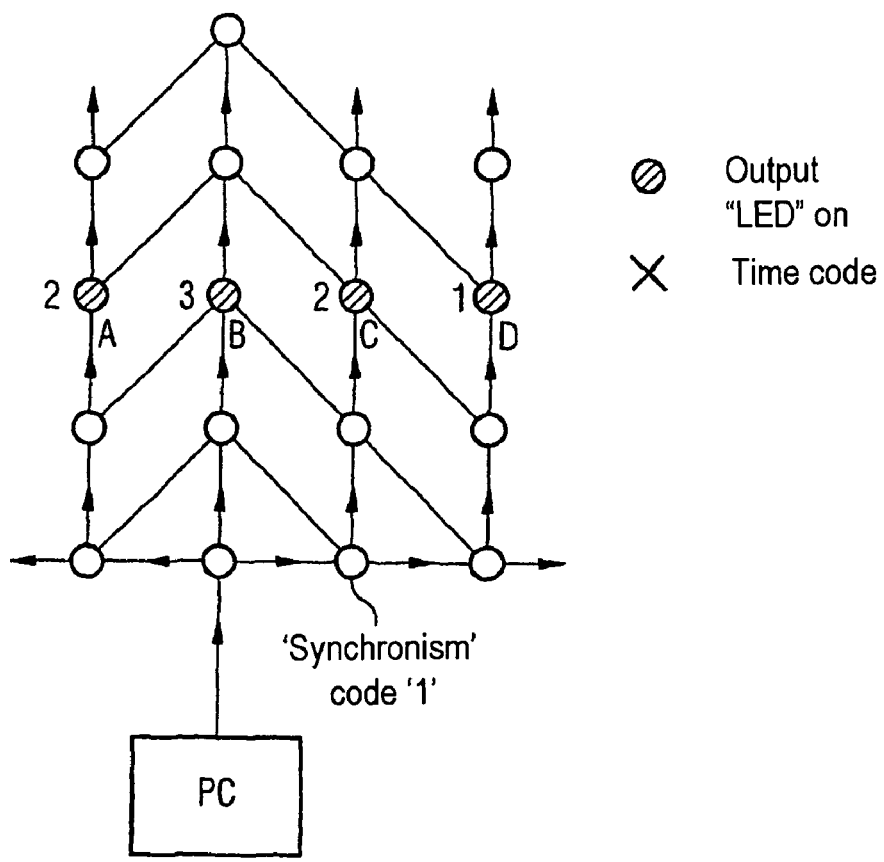
FIG. 6 illustrates a sketch of a processor array according to an exemplary embodiment of the invention in which synchronized predefined driving of the processor elements of the processor array is explained.

In general, a processor element of a processor array is illustrated as symbolized by a circle in FIG. 5 and FIG. 6.

When displaying the data, care must be taken that this must be displayed synchronously and at the same time by the respective image-generating elements of the processor array.

According to this exemplary embodiment, in order to ensure time-synchronous display of information when the electronic messages are fed into the processor array by the interface processor, that before the electronic messages are fed in, on the basis of the feed point of the electronic messages and the symbols to be displayed, the interface processor calculates the routing paths and the latency of the electronic message in the processor array to the respective target processor element by whose image-generating element the respective information contained in the message is to be displayed, and the time change of an output.

The result of the computation is given, according to one embodiment of the invention, by the output values at a specific time, specified in time cycles, since the processor array is clocked globally synchronously and an electronic message is transmitted from one processor element to a processor element arranged immediately adjacent thereto in each case in relation to one clock time.

For all data to be displayed, the time at which the data must be available in the respective processor element in order to output the information to be displayed to a user at the correct time is calculated for each processor element. The time data is calculated for all the processor elements of the processor array and loaded in advance into the memory of the processor elements.

To output an item of information, the interface processor sends a time code into the network, that is to say into the processor array. The time code is forwarded each time a new time code occurs.

FIG. 6 illustrates, by means of a marked line, how the time code is distributed in the processor array. By using the time code plotted on the processors A, B, C, D, the output from the image-generating elements of the processor elements A, B, C, D is set time-synchronously to "light-emitting diode on" at the time T=4.

According to this exemplary embodiment illustrated in FIG. 6, the spacing, specified in time cycles, from the first processor element A to the interface processor is three time cycles, the distance of the second processor element B is two time cycles, the distance from the processor element C is three time cycles and the spacing of the fourth processor element D is four time cycles.

It is thus necessary to wait for at least four time cycles until the information to be displayed by the four processor elements A, B, C, D at one time is available in all the processor elements.

Only after the transmission of the information has also been carried out as far as the fourth processor element D is it possible to output the information by all four processor elements A, B, C, D.

In order to ensure this time-synchronous display of information, it is necessary for a short interrupt latency time as compared with the required frame rate, which designates a time interval from the first image to be displayed to a second immediately following image, to be assumed.

Given a frame rate of 20 images per second, that is to say a frame repetition interval of 50 milliseconds, and a processor array having at most 256×256 processors, the supply and simultaneous control and display of information by all the processors within the processor array can be achieved even with commercially available processors.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A processor array comprising:
    a multiplicity of processor elements, each processor element comprising:
        at least one processor;
        a plurality of power supply interfaces for transmitting electricity from and to a plurality of processor elements adjacent to the respective processor element;
        a plurality of power supply switches, each power supply interface being assigned a power supply switch, with which electricity can be supplied or not supplied to the respective power supply interface as desired;
        testing means for sequentially testing whether there is an electrical short-circuit at a power supply interface to a coupled adjacent processor element;
        control means for closing the respective power supply switch so that electricity can be supplied to the power supply interface when there is no short-circuit on the power supply interface; and
        wherein at least to some extent, only the processor elements that are arranged locally directly adjacent to one another are coupled to one another in order to exchange electronic messages and to transmit electricity.

2. The processor array of claim 1, wherein at least some of the processor elements have a sensor or an actuator that is coupled to the processor, and wherein sensor data or actuator data is transmitted in the electronic messages between the processor elements arranged adjacent to one another.

3. The processor array of claim 1, wherein the testing means further comprises at least one short-circuit testing unit that has a current limiting device.

4. The processor array of claim 3, wherein each power supply switch is assigned a current limiting device.

5. The processor array of claim 4, wherein at least part of the power supply switch is set up as a current-limited switch.

6. The processor array of claim 1, wherein the processor elements are arranged in matrix form in rows and columns.

7. The processor array of claim 1, further comprising at least one interface processor that provides a message interface of the processor array.

8. The processor array of claim 2, wherein sensor data or actuator data is transmitted in the electronic messages from and to the interface processor.

9. A fabric structure comprising:
    a processor array having a multiplicity of processor elements, each processor element comprising:
        at least one processor;
        a plurality of power supply interfaces for transmitting electricity from and to a plurality of processor elements adjacent to the respective processor element;
        a plurality of power supply switches, each power supply interface being assigned a power supply switch, with which electricity can be supplied or not supplied to the respective power supply interface as desired;
        testing means for sequentially testing whether there is an electrical short-circuit at a power supply interface to a coupled adjacent processor element;
        control means for closing the respective power supply switch so that electricity can be supplied to the power supply interface when there is no short-circuit on the power supply interface; and
    wherein the processors, sensors, or actuators are arranged in the fabric structure;
    electrically conductive filaments that couple the processors to one another;
    conductive data transmission filaments that couple the processors to one another; and
    electrically nonconductive filaments.

10. The fabric structure of claim 9, wherein the electrically conductive filaments are configured to be used for the power supply to the plurality of processors, sensors, or actuators.

11. The fabric structure of claim 9, wherein the conductive data transmission filaments are electrically conductive.

12. The fabric structure of claim 9, wherein the conductive data transmission filaments are optically conductive.

13. The fabric structure of claim 9, wherein the actuator is set up as at least one of the following elements:
    an image-generating element;
    a sound wave generating element; and
    a vibration-generating element.

14. The fabric structure of claim 9, wherein a surface covering is fixed on the fabric structure.

15. The fabric structure of claim 14, wherein the surface covering is adhesively bonded, laminated, or vulcanized on the fabric structure.

16. The fabric structure of claim 14, wherein the surface covering is formed as one of a wall-covering structure, a floor-covering structure and a ceiling-covering structure.

17. The fabric structure of claim 14, wherein a textile layer interspersed uniformly with electrically conductive wires is applied at least over subregions of the fabric structure.

18. A processor element, comprising:
    at least one processor;
    a plurality of power supply interfaces for transmitting electricity from and to a plurality of processor elements adjacent to the respective processor element;
    a plurality of power supply switches, each power supply interface being assigned a power supply switch, with which electricity can be supplied or not supplied to the respective power supply interface;

at least one short-circuit testing unit for sequentially testing whether there is an electrical short-circuit at a power supply interface to a coupled adjacent processor element; and a control unit configured such that the respective power supply switch closes so that electricity can be supplied to the power supply interface when there is no short-circuit on the power supply interface.

19. A method for transmitting electricity between a multiplicity of processor elements arranged locally adjacent to one another, each processor element comprising:

at least one processor;

a plurality of power supply interfaces for transmitting electricity from and to a plurality of processor elements adjacent to the respective processor element;

a plurality of power supply switches, each power supply interface being assigned a power supply switch, with which electricity can be supplied or not supplied to the respective power supply interface as desired;

at least to some extent, only the processor elements arranged locally directly adjacent to one another being coupled to one another to exchange electronic messages and to transmit electricity, sensor data and/or actuator data being transmitted in electronic messages between the processor elements;

the method comprising checking at a power supply interface as to whether there is an electric short-circuit to coupled adjacent processor element.

20. The method of claim 19, further comprising closing the respective power supply switch so that electricity can be supplied to the power supply interface when there is no short-circuit at the power supply interface.

* * * * *